United States Patent [19]

Sakai

[11] 4,375,598

[45] Mar. 1, 1983

[54] TRANSISTOR CIRCUIT HAVING TWO COMPARATOR LEVELS

[75] Inventor: Koichi Sakai, Tokyo, Japan

[73] Assignee: Toko, Inc., Tokyo, Japan

[21] Appl. No.: 136,752

[22] Filed: Apr. 3, 1980

[30] Foreign Application Priority Data

Apr. 5, 1979 [JP] Japan ..................... 54-045150[U]

[51] Int. Cl.³ ........................................ H03K 5/153
[52] U.S. Cl. ................. 307/360; 307/290; 307/359
[58] Field of Search ............ 307/290, 358, 359, 360, 307/601, 608, 299 B

[56] References Cited
U.S. PATENT DOCUMENTS 3,416,004 12/1968 Taylor ............................... 307/290
4,104,547 8/1978 Frederiksen et al. ............... 307/290
4,184,087 1/1980 Nutz .................................... 307/358
4,259,601 3/1981 Stein ................................... 307/359

*Primary Examiner*—John Zazworsky
*Attorney, Agent, or Firm*—Lowe, King, Price & Becker

[57] ABSTRACT

A comparator receives an input voltage as well as one of two comparator levels and compares them to selectively produce one of two outputs having different values. A comparator level generator is connected to the comparator for selectively applying one of the two comparator levels to the comparator under the control of a controlling means. The controlling means is connected to both of the comparator level generator and the comparator for controlling the comparator level generator so as to change the comparator level in response to the new state of the comparator.

2 Claims, 5 Drawing Figures

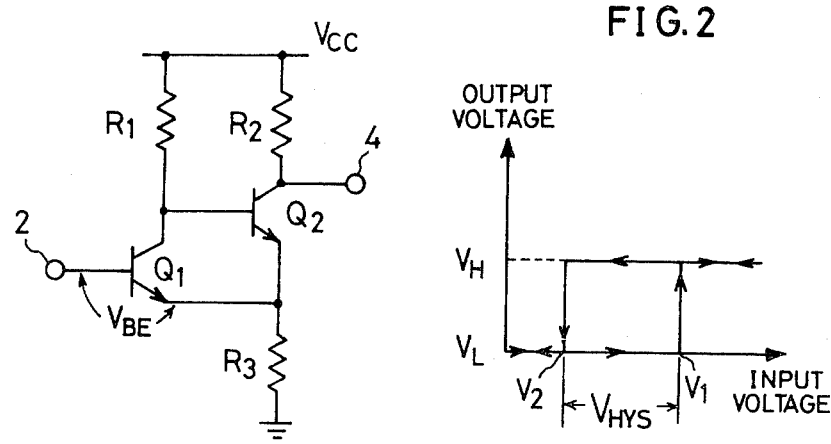
FIG.1 PRIOR ART
FIG.2
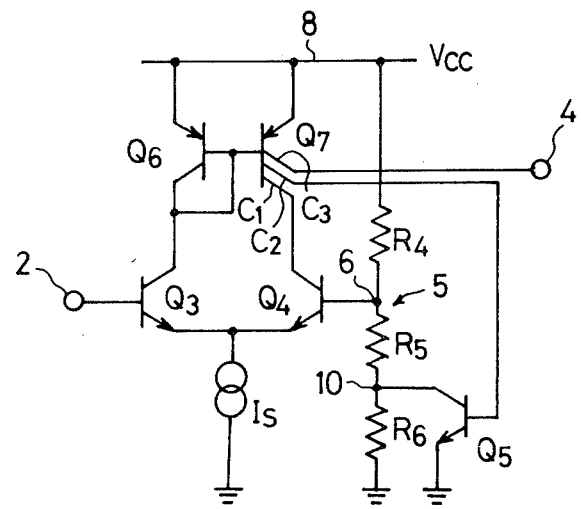
FIG.3

TRANSISTOR CIRCUIT HAVING TWO COMPARATOR LEVELS

FIELD OF THE INVENTION

This invention relates to a transistor circuit having two comparator levels which can be determined with ease and which is substantially free from ambient temperature change.

BACKGROUND OF THE INVENTION

The embodiments of this invention will be discussed following a description of related prior art in connection with FIGS. 1 and 2 of the accompanying drawings.

FIG. 1 is a schematic circuit diagram showing a conventional Schmitt trigger circuit which functions as a voltage comparator and comprises two transistors Q1 and Q2, and three resistors R1, R2 and R3. In operation, when the voltage of an input signal applied to an input terminal 2 is initially lower than a first comparator level $V_1$ (FIG. 2), the transistors Q1 and Q2 are off and on, respectively. As a result, a low output voltage $V_L$ is derived from an output terminal 4. If the input signal rises up to the first comparator level $V_1$, the transistors Q1 and Q2 change their states becoming on and off, respectively. The circuit of FIG. 1, therefore, produces a high output voltage $V_H$ at the output terminal 4. The first comparator level $V_1$ is expressed:

$$V_1 = (V_{CC} - V_{CE(sat)})R3/(R2+R3) + V_{BE} \qquad (1)$$

where $V_{CC}$: voltage of power supply
$V_{CE(sat)}$: collector saturation voltage of Q2
$V_{BE}$: emitter-base voltage of Q1

Conversely, when the input signal, after exceeding $V_1$, falls to a second comparator level $V_2$ (FIG. 2), the Schmitt trigger circuit of FIG. 1 returns to its original state producing the low voltage $V_L$ at the output terminal 4. The second comparator level $V_2$ is given by following equation;

$$V_2 = (V_{CC} - V'_{CE(sat)})R3/(R1+R3) + V_{BE}, \qquad (2)$$

where $V'_{CE}$: collector saturation voltage of Q1. Assuming that $V'_{CE(sat)}$ is identical with $V_{CE(sat)}$, a hysteresis range $V_{HYS}$ is obtained from the equations (1) and (2):

$$V_{HYS} = V_1 - V_2 \qquad (3)$$

$$= (V_{CC} - V_{CE(sat)})R3 \left( \frac{1}{R2+R3} - \frac{1}{R1+R3} \right).$$

It will therefore be apparent from the equations (1) and (2) that since $V_{BE}$ is a temperature dependent parameter, the first and the second comparator levels $V_1$ and $V_2$ are adversely affected by ambient temperature change. Therefore, there has been a problem with the conventional Schmitt trigger circuit that a temperature compensating means should be provided in order to assure stable comparator levels against ambient temperature change.

It is therefore a primary object of this invention to provide an improved transistor circuit having two different comparator levels which can be determined or designed with ease.

Another object of this invention is to provide an improved transistor circuit having two different comparator levels which are free from ambient temperature change.

SUMMARY OF THE INVENTION

The invention takes the form of a transistor circuit having two different comparator levels, which comprises: a comparator receiving an input voltage through an input terminal and also receiving one of the comparator levels through a comparator level applied terminal, for comparing the input voltage with the comparator level to selectively produce one of two outputs having different values at an output terminal; a comparator level generator which is connected to said comparator through the comparator level applied terminal for selectively generating and applying one of the two comparator levels to the comparator; and controlling means which is connected to both of the comparator level generator and the comparator for controlling the comparator level generator so as to change the comparator level in response to the new state of the comparator.

These and other objects, features and many of the attendant advantages of this invention will be appreciated more readily as the same becomes better understood by reference to the following detailed description, when considered in connection with the accompanying drawings, wherein like parts in each of the several figures are identified by the same reference characters.

BRIEF DESCRIPTION OF THE DRAWINGS

FIG. 1 is a schematic circuit diagram of a conventional Schmitt trigger circuit;

FIG. 2 is a schematic hysteresis curve for the convenience of explaining the conventional circuit and the embodiments of this invention; and FIGS. 3 through 5 are schematic circuit diagrams showing a first, second and third embodiments of this invention, respectively.

DETAILED DESCRIPTION OF THIS INVENTION

Figure 4:
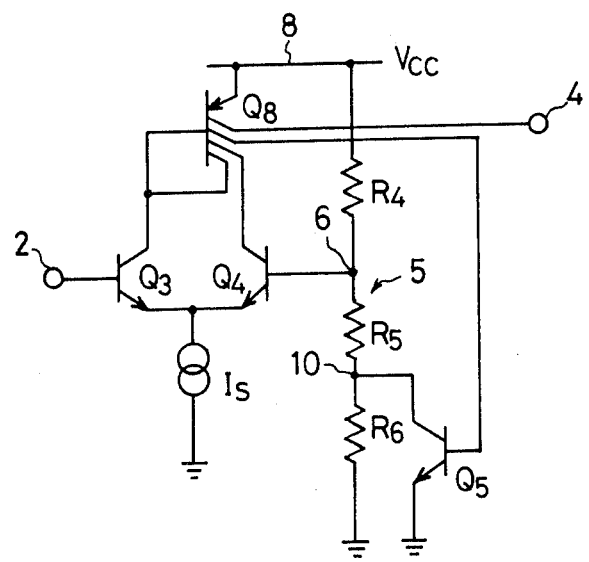

The first embodiment of this invention as represented schematically in FIG. 3 comprises a first and second transistors Q3 and Q4 the emitters of which are directly connected to each other and to a constant current source $I_S$. The bases of the transistors Q3 and Q4 are connected to the input terminal 2 and a junction 6 of a voltage divider 5, respectively. The voltage divider 5 consists, in this embodiment, of three resistors R4, R5 and R6 arranged in series between a power supply line 8 and ground. The collector of the transistor Q3 is connected to the base of a transistor Q6, which is directly connected to the collector thereof so that the transistor Q6 functions as a diode. The base of the transistor Q6 is also connected to the base of a multi-collector transistor Q7. The collector of the transistor Q4 is connected to a first collector C1 of Q7. A second collector C2 is connected to the base of a transistor Q5 which functions as a control means for the voltage divider 5. A third collector C3 is connected to the output terminal 4. The emitter of Q7 is coupled to the power supply line 8. The transistor Q5 has its emitter grounded and its collector connected to a junction 10 of the voltage divider 5.

The transistors Q6 and Q7 form a so-called current mirror circuit. Therefore, each of currents flowing through the collectors C1 through C3 is controlled by a current flowing into the collector of Q3 and preferably identical therewith.

In operation, when the input voltage applied to the input terminal 2 is initially below a first comparator level V'₁, the transistors Q3 and Q4 are off and on, respectively. In this case, the transistor Q5 is in its nonconductive state so that the first comparator level V'₁ is defined as follows:

$$V'_1 = V_{CC} \frac{R5 + R6}{R4 + R5 + R6}. \quad (4)$$

Since the transistor Q3 is off, no current is permitted to pass through the transistor Q6. As a result, the transistor Q7 is off, so that the transistor Q4, although biased to be conductive, does not receive any current from Q7. If the input voltage rises to the first comparator level V'₁, then the transistor Q3 is turned on with the result of the turn on of the transistors Q7 and Q5. The turn on of Q5 causes the comparator level V'₁ at the junction 6 to change from V'₁ to a second comparator level V'₂, which is defined as follows:

$$V'_2 = V_{CC} \frac{R5}{R4 + R5} + V_{CE(sat)}, \quad (5)$$

where $V_{CE(sat)}$: collector saturation voltage of Q5. However, in the equation (5), $V_{CE(sat)}$ is so small as to be negligible so that V'₂ may be defined as $$V'_2 = V_{CC} \frac{R5}{R4 + R5}. \quad (6)$$

A hysteresis range V'$_{HYS}$ is accordingly defined as follows:

$$V'_{HYS} = V'_1 - V'_2 \quad (7)$$

$$= V_{CC} \left( \frac{R5 + R6}{R4 + R5 + R6} - \frac{R5}{R4 + R5} \right).$$

It will therefore be apparent that since the first comparator level V'₁ is a function only of $V_{CC}$ and the resistances of the resistors R4 through R6, V'₁ is free from any ambient temperature change. Furthermore, $V_{CE(sat)}$ is very small compared with $V_{CC}$ and is very stable against the ambient temperature change compared with $V_{BE}$, so that the second comparator level V'₂ is also substantially free from influence by the ambient temperature change. Thus, according to this invention, the temperature dependency of the comparator levels of the prior art can be totally avoided.

Figure 5:
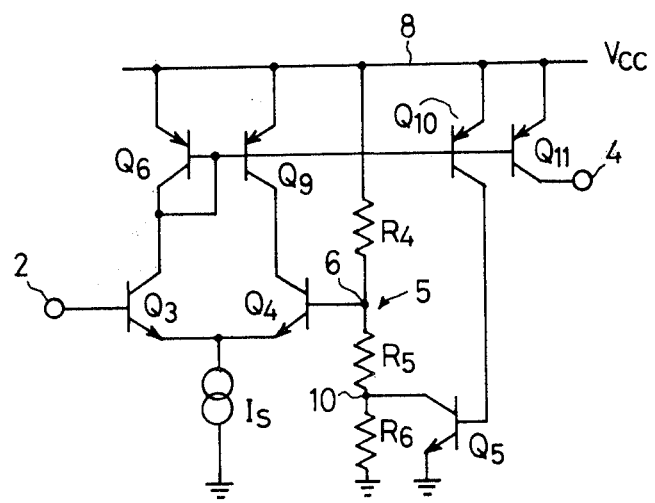

Reference is now made to FIGS. 4 and 5, wherein the second and the third embodiments of this invention are shown, respectively. The difference between the first and the second embodiments is that the transistors Q6 and Q7 of the former are combined into a single multi-collector transistor Q8. The second embodiment of FIG. 4 is identical with the first in operation, but features suitability for integrated circuit manufacturing because of smaller space occupation by the transistor Q8.

Whilst, the difference between the first and the third embodiment is that the transistor Q7 of the former is divided into three separate transistors Q9, Q10 and Q11. The circuit operation of the third embodiment is identical with that of the first, so further description will be omitted for brevity.

It is understood from the above that the comparator levels V'₁ and V'₂ can be determined or designed with ease in that each of them is a function only of $V_{CC}$ and the resistances of the resistors.

In the above preferred embodiments, the resistors of the voltage divider 5 can be replaced by other suitable elements such as Zener diodes.

While this invention has been described in terms of specific illustrative embodiments, it is clear to those skilled in the art to which it relates that the embodiments each is susceptible of a wide range of modification within the spirit and scope of the appended claims.

What is claimed is:

1. A transistor circuit having two different comparator reference levels to establish stable hysteresis comprising:
   an input terminal;
   an output terminal;
   a comparator reference level applied terminal;
   a constant current source;
   first and second transistors having emitters connected respectively to said constant current source and having bases connected respectively to said input terminal and said comparator reference level applied terminal;
   a comparator reference level generator including a plurality of resistors arranged in series, and being connected to said comparator reference level applied terminal for selectively generating and applying to said applied terminal one of said two comparator reference levels;
   a third transistor the collector and the emitter of which are connected across one of the resistors of said comparator reference level generator;
   a current mirror circuit including a fourth transistor and a multi-collector transistor, the base of said fourth transistor being connected to both the collector of said fourth transistor and the collector of said first transistor, and the emitter of said fourth transistor being connected to a power supply, said multi-collector having first, second and third collectors, the base of said multi-collector transistor being connected to the base of said fourth transistor, said first collector being connected to the collector of said second transistor, said second collector being connected to the base of said third transistor, said third collector being connected to said output terminal, and the emitter of said multi-collector transistor being connected to the power supply.

2. A transistor circuit having two different comparator references levels to establish stable hysteresis comprising:
   an input terminal;
   an output terminal;
   a comparator reference level applied terminal;
   a constant current source;
   first and second transistors having emitters connected respectively to said constant current source and bases connected respectively to said input terminal and said comparator reference level applied terminal;
   a comparator level generator including a plurality of resistors arranged in series, and being connected to said comparator reference level applied terminal for selectively generating and applying to said applied terminal one of said two comparator reference levels;

a third transistor the collector and the emitter of which are connected across one of the resistors of said comparator reference level generator;

a current mirror circuit including a multi-collector transistor having first, second third and fourth collectors, the base of said multi-collector transistor being connected to both said first collector and the collector of said first transistor, said second collector being connected to the collector of said second transistor, said third collector being connected to the base of said third transistor and said fourth collector being connected to said output terminal, and the emitter of said multi-collector transistor being connected to a power supply.

* * * * *